US009601818B2

(12) United States Patent
Fujita et al.

(10) Patent No.: US 9,601,818 B2
(45) Date of Patent: Mar. 21, 2017

(54) MICROWAVE CIRCUIT

(71) Applicant: Panasonic Intellectual Property Management Co., Ltd., Osaka (JP)

(72) Inventors: Suguru Fujita, Tokyo (JP); Maki Nakamura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 90 days.

(21) Appl. No.: 14/420,265

(22) PCT Filed: Jun. 3, 2014

(86) PCT No.: PCT/JP2014/002933
§ 371 (c)(1),
(2) Date: Feb. 6, 2015

(87) PCT Pub. No.: WO2014/208010
PCT Pub. Date: Dec. 31, 2014

(65) Prior Publication Data
US 2015/0207197 A1      Jul. 23, 2015

(30) Foreign Application Priority Data

Jun. 25, 2013   (JP) .................................. 2013-132928

(51) Int. Cl.
*H01L 23/538*   (2006.01)
*H01P 3/08*    (2006.01)
(Continued)

(52) U.S. Cl.
CPC ............ *H01P 3/08* (2013.01); *H01L 23/5385* (2013.01); *H01L 23/5386* (2013.01);
(Continued)

(58) Field of Classification Search
CPC .............. H05K 1/0243; H05K 1/0298; H05K 2201/10734; H05K 1/115; H05K 3/4614;
(Continued)

(56) References Cited

U.S. PATENT DOCUMENTS 5,929,729 A * 7/1999 Swarup .................. H01P 3/085
                                                          333/116
6,239,385 B1 * 5/2001 Schwiebert .......... H05K 1/0222
                                                          174/261
(Continued)

FOREIGN PATENT DOCUMENTS

JP     2001-094340     4/2001
JP     2004-047702     2/2004
(Continued)

OTHER PUBLICATIONS

International Search Report of PCT application No. PCT/JP2014/002933 dated Aug. 26, 2014.

*Primary Examiner* — Dean Takaoka
*Assistant Examiner* — Alan Wong
(74) *Attorney, Agent, or Firm* — Greenblum & Bernstein, P.L.C.

(57) ABSTRACT

A microwave circuit with which cracks in substrates can be suppressed and which can reduce the size of module including the microwave circuit is provided. The microwave circuit includes a multilayer first substrate, a second substrate that opposes the first substrate, a plurality of first electrically conductive members that electrically connect a first layer of the first substrate and the second substrate to each other, a plurality of second electrically conductive members that electrically connect the first layer of the first substrate and another layer of the first substrate to each other and each of the plurality of second electrically conductive members has a smaller diameter than that of each of the first electrically conductive members, and transmission lines that (Continued)

connect the first electrically conductive members and the second electrically conductive members. In the microwave circuit, the plurality of first electrically conductive members and the plurality of second electrically conductive members are alternately disposed along an end portion of the first substrate.

11 Claims, 6 Drawing Sheets

(51) Int. Cl.
 *H01L 23/31* (2006.01)
 *H01L 23/66* (2006.01)
 *H01L 23/00* (2006.01)
 *H01L 25/065* (2006.01)

(52) U.S. Cl.
 CPC ...... *H01L 23/5389* (2013.01); *H01L 23/3121* (2013.01); *H01L 23/66* (2013.01); *H01L 24/16* (2013.01); *H01L 25/0655* (2013.01); *H01L 2223/6677* (2013.01); *H01L 2224/16225* (2013.01); *H01L 2924/12042* (2013.01); *H01L 2924/1533* (2013.01)

(58) Field of Classification Search
 CPC ............. H01L 23/5385; H01L 23/5386; H01L 23/5389
 USPC ........... 333/246, 33; 174/68.5, 261; 439/676
 See application file for complete search history.

(56) References Cited

U.S. PATENT DOCUMENTS

| | | | |
|---|---|---|---|
| 6,342,864 B1 | 1/2002 | Muramoto et al. | |
| 6,521,845 B1 * | 2/2003 | Barrow | H05K 1/0207 174/260 |
| 6,566,601 B2 * | 5/2003 | Maetani | H01L 23/49838 174/261 |
| 7,884,463 B2 * | 2/2011 | Ozawa | H01L 23/49838 257/690 |
| 7,915,079 B1 | 3/2011 | Sasaki et al. | |
| 7,998,796 B2 * | 8/2011 | Danno | H01L 21/6835 257/737 |
| 8,836,149 B2 * | 9/2014 | Son | H01L 23/49816 257/784 |
| 2009/0065949 A1 * | 3/2009 | Yim | H01L 25/105 257/777 |
| 2009/0309210 A1 * | 12/2009 | Danno | H01L 21/6835 257/690 |
| 2010/0258953 A1 | 10/2010 | Takeda | |
| 2014/0103527 A1 * | 4/2014 | Marimuthu | H01L 23/3121 257/737 |

FOREIGN PATENT DOCUMENTS

| | | |
|---|---|---|
| JP | 2007-208153 | 8/2007 |
| JP | 2007-287820 | 11/2007 |
| JP | 2011-166110 | 8/2011 |
| JP | 2012-256956 | 12/2012 |

* cited by examiner

MICROWAVE CIRCUIT

TECHNICAL FIELD

The present invention relates to microwave circuits.

BACKGROUND ART

Conventionally, a known semiconductor device that includes a microwave circuit includes a package substrate, a semiconductor chip disposed on a main surface of the package substrate, and a plurality of solder balls provided on a plurality of land portions on a rear surface of the package substrate. In this semiconductor device, through-holes electrically connected to the land portions disposed in an outermost portion of the package substrate are formed closer to the center of the substrate than the land portions (for example, see PTL 1).

CITATION LIST

Patent Literature

PTL 1: Japanese Unexamined Patent Application Publication No. 2007-208153

SUMMARY OF INVENTION

In the conventional semiconductor device, it is difficult to suppress cracks in a substrate and reduce the size of a module that includes the microwave circuit.

The present disclosure is proposed in view of the above-described situation. The present disclosure provides a microwave circuit with which cracks in a substrate can be suppressed and which can reduce the size of a module including the microwave circuit.

A microwave circuit according to an embodiment of the present disclosure includes a first substrate that is a multi-layer substrate, a second substrate that opposes the first substrate, a plurality of first electrically conductive members that electrically connect a first layer of the first substrate and the second substrate to each other, a plurality of second electrically conductive members that electrically connect the first layer of the first substrate and another layer of the first substrate to each other, and each of the plurality of second electrically conductive members has a smaller diameter than that of each of the first electrically conductive members, and transmission lines that connect the first electrically conductive members and the second electrically conductive members. In the microwave circuit, the plurality of first electrically conductive members and the plurality of second electrically conductive members are alternately disposed along an end portion of the first substrate. A generic or specific embodiment of these may be realized by a system, a method, or an arbitrary combination of a system and a method.

According to the present disclosure, cracks in the substrates can be suppressed and the size of the module that includes the microwave circuit can be reduced.

DESCRIPTION OF EMBODIMENTS

Embodiments of the present disclosure are described below with reference to the drawings.

Underlying Knowledge Forming Basis of an Embodiment of the Present Disclosure Assuming that a plurality of solder balls are arranged at end portions of two substrates in a semiconductor device of PTL 1. In this case, the plurality of solder balls having larger diameters than those of through-holes are arranged along outer peripheries of the substrates. This increases the areas of package substrates, and accordingly, it is difficult to reduce the size of a module.

In contrast, when arrangement of the through-holes and the solder balls relative to one another is not particularly restricted in the design of the semiconductor device of PTL 1, the solder balls may be disposed inside the through-holes in the substrates. Since the diameters of the solder balls are larger than those of the through-holes, the package substrates easily crack from the outer peripheries thereof in the above-described arrangement.

Hereafter, a microwave circuit with which cracks in substrates can be suppressed and which can reduce the size of a module including the microwave circuit is described.

The microwave circuit of the embodiments below is disposed, for example, in a wireless module (simply referred to as a module hereafter) that communicates microwave (for example, a millimeter wave of 60 GHz) signals.

First Embodiment

Figure 1:
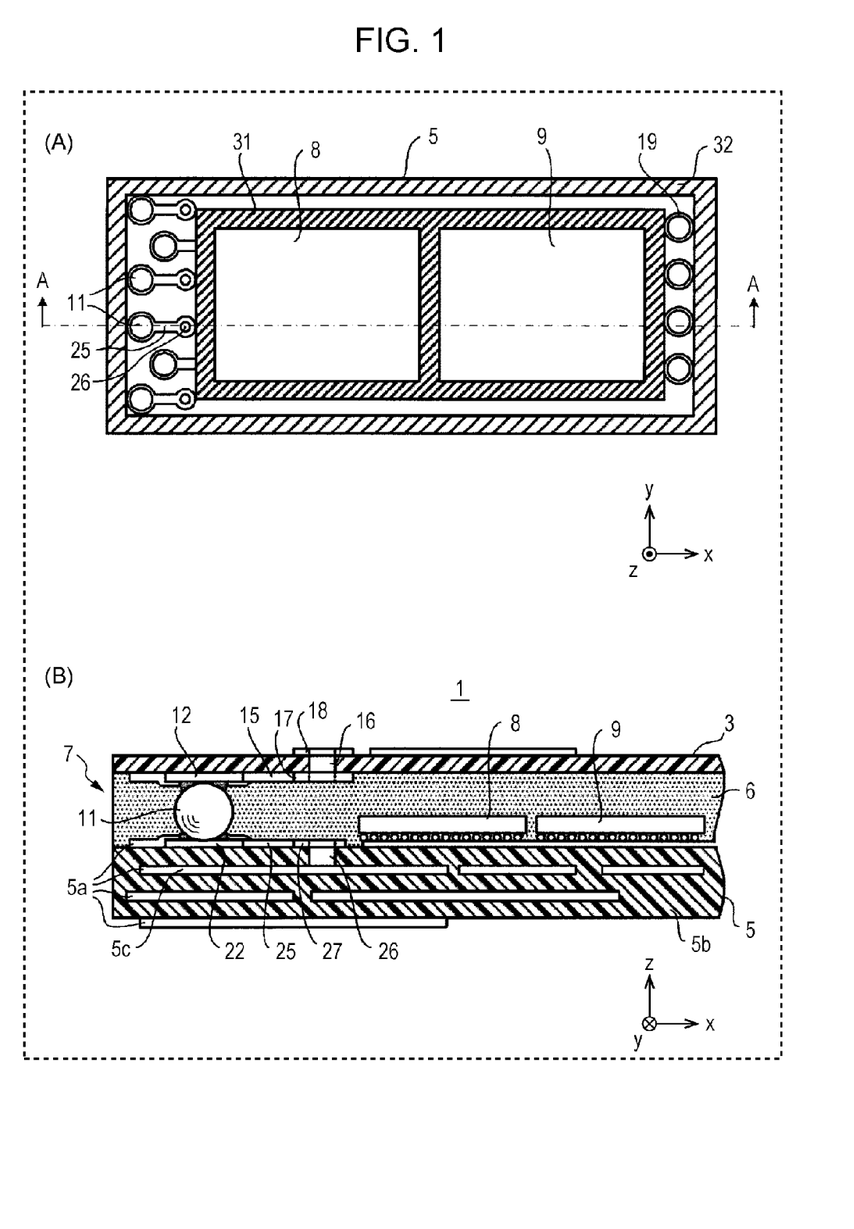
FIG. 1 is a plan view of an example of a structure of a module that includes a microwave circuit according to a first embodiment and a sectional view of the module taken along line A-A.

FIG. 1(A) is a plan view of an example of a structure of the module in which the microwave circuit according to a first embodiment is disposed. FIG. 1(A) illustrates the surface of a lower substrate 5 when the module is seen through from above (positive Z-axis direction). FIG. 1(B) is a sectional view of the example of the structure of a module 1 taken along line A-A in FIG. 1(A). Part of a right end (end portion in the positive X-axis direction) is omitted from FIG. 1(B).

The module 1 includes the lower substrate 5 and an upper substrate 3, which are superposed with each other. In FIG. 1(B), a plane parallel to the surfaces of the substrates is defined as an X-Y plane. A horizontal direction in FIG. 1(B) is defined as the X direction and a depth direction in FIG. 1(B) is defined as the Y direction. A direction perpendicular to the surface of the substrate, that is, a vertical direction in FIG. 1(B) is defined as the Z direction.

The upper substrate 3 (an example of a second substrate, another substrate) uses, for example, a double-sided substrate. The lower substrate 5 (an example of a first substrate) uses, for example, a multilayer substrate that includes four metal layers 5a and a dielectric layer 5b formed by, for example, filling resin among the metal layers 5a. A molded portion 6 is provided between the upper substrate 3 and the lower substrate 5 so as to support these substrates. The molded portion 6 is formed by, for example, filling with resin.

For example, two LSIs 8 and 9 are mounted on a surface of the lower substrate 5 opposite the upper substrate 3. Solder balls 11 (an example of first electrically conductive members) are disposed between the lower substrate 5 and the upper substrate 3. Electrical conduction is established between the solder balls 11 and solder ball pads 22, which are formed on the surface of the lower substrate 5 opposite the upper substrate 3, and between the solder balls 11 and solder ball pads 12, which are formed on a surface of the upper substrate 3 opposing the lower substrate 5, so as to electrically connect the lower substrate 5 and the upper substrate 3 to each other.

The solder ball pads 22 formed on the surface of the lower substrate 5 are, for example, connected to a wiring pattern or a GND pattern (ground pattern) via transmission lines 25, via pads 27 and substrate vias 26. The wiring or GND patterns are formed on the metal layers 5a (example of another layer) of the lower substrate 5. The upper surface of the lower substrate 5 is a surface layer and serves as an example of a first layer. The substrate vias 26 (example of second electrically conductive members) are electrically conductive vias and connected to, for example, a GND layer 5c. Although it is not illustrated in FIG. 1(B), other solder ball pads are, for example, connected through transmission lines to the wiring pattern on the same layer as the layer on which the other pads are formed.

The solder ball pads 12, which are formed on the surface of the upper substrate 3 opposite the lower substrate 5, are connected to the wiring or the GND pattern through, for example, transmission lines 15, substrate vias 16, and via pads 17 and 18. This wiring or GND pattern is formed on the surface of the upper substrate 3. Here, the pads 12 are connected to, for example, the GND pattern. The substrate vias 16 are electrically conductive vias and connect to each other the via pads 17 and 18 formed on the respective surfaces of the upper substrate 3.

A microwave circuit 7 communicates signals of microwave frequencies including millimeter wave frequencies. The microwave circuit 7 includes, for example, the solder balls 11, the solder ball pads 12 and 22, the transmission lines 15 and 25, the substrate vias 16 and 26, and the via pads 17, 18, and 27.

The solder balls 11 are positioned in the design such that the solder balls 11 are not superposed with the substrate vias 16 and 26 and the via pads 17, 18, and 27 on both the upper substrate 3 and the lower substrate 5 in a direction perpendicular to the surfaces of the substrates (Z direction). The reason for this is to prevent breakage of the substrate vias 16 and 26 due to the substrate vias 16 and 26 being subjected to stress applied to the substrates when the solder balls 11 are placed.

As illustrated in FIG. 1(A), prohibited areas 31 and 32, which are hatched in FIG. 1(A), are set in the outer peripheral ends of the lower substrate 5.

Arrangement of the solder balls 11 and substrate vias 26 is prohibited in the prohibited area 31 so that the solder balls 11 and the substrate vias 26 are not disposed close to the electronic components (for example, LSIs 8 and 9) mounted inside the prohibited area 31. Arrangement of the solder balls 11 and the substrate vias 26 is prohibited in the prohibited area 32.

Furthermore, four dummy solder balls 19 are disposed at the right end (end portion in the positive X-axis direction) of the lower substrate 5 so as to maintain left-right (X direction) balance. Prohibited areas are also set in the upper substrate 3, which opposes the lower substrate 5, similarly to the prohibited areas 31 and 32 of the lower substrate 5.

In the microwave circuit 7, the plurality of adjacent solder balls 11 along a left end portion of the lower substrate 5 are arranged in directions (inclined directions) inclined at a specified angle (for example, 45 degrees) relative to a direction along the end portion (Y direction) so as to be arranged in a zigzag manner.

Figure 2:
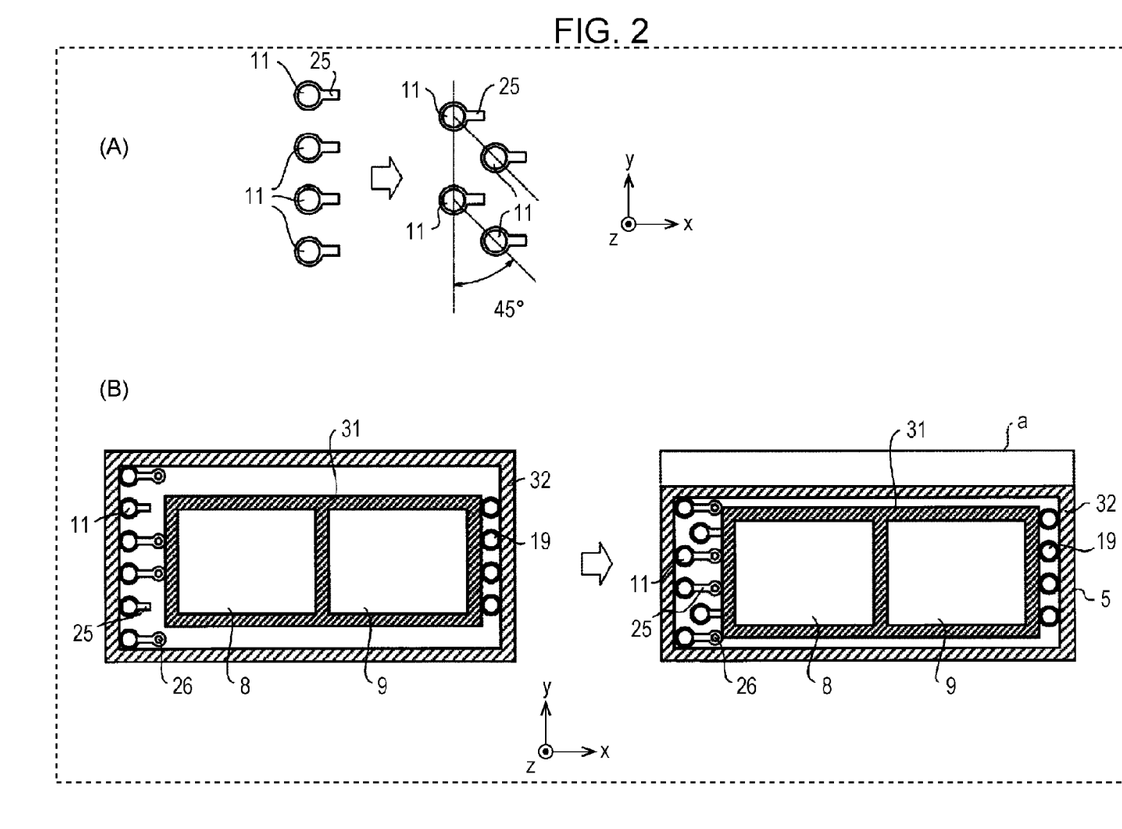
FIG. 2 is a schematic view illustrating a comparative example of arrangement of solder balls in the first embodiment and a schematic view illustrating an example of arrangement of the solder balls in the first embodiment.

FIGS. 2(A) and 2(B) are schematic views illustrating a comparative example and an example of arrangement of the plurality of solder balls 11 adjacent to one another along the end portion of the lower substrate 5. With reference to FIGS. 2(A) and 2(B), the following cases of the arrangement of the adjacent solder balls 11 are compared: that is, the case where the adjacent solder balls 11 are arranged in a single column with the left ends thereof aligned; and the case where the adjacent solder balls 11 are arranged in the 45-degree inclined directions so as to be arranged in the zigzag manner.

When the solder balls 11 are mounted on the upper substrate 3 or the lower substrate 5 in a primary mounting, or when the upper substrate 3 and the lower substrate 5 are bonded to each other in a secondary mounting, the solder balls 11 are spaced apart from one another by a specified space between the balls (for example, a space equal to or larger than the diameter of the solder balls 11). This can prevent the solder balls 11 from being in contact with one another.

Specifically, when the thickness of the LSIs 8 and 9 embedded in the module 1 is 300 μm, and the height of mounting portions of the LSIs 8 and 9 is 50 μm, it is required that the diameter of the solder balls 11 be, for example, 400 μm. In order to separate an end of one of the solder balls 11 and an end of another solder ball 11 by 400 μm, the center-to-center distance between the adjacent solder balls 11 is 800 μm.

When six solder balls 11 are arranged in a single column in the Y direction as illustrated in FIG. 2(B), the length of the module 1 in FIG. 1(B) in the vertical direction (Y direction) is as follows: that is, with the prohibited area 32 having a width of 500 μm set at the outer periphery of the module 1, a minimum length of the module 1 in the vertical direction (Y direction) is 5400 μm regardless of the sizes of the LSIs 8 and 9.

When the adjacent solder balls 11 are horizontally (X direction) shifted from one another so as to be arranged in directions at a specified angle (for example, 45 degrees), thereby being arranged in the zigzag manner as illustrated on the right of FIG. 2(B), the distance between the balls in the vertical direction (Y direction) is 1/(√2) times that of the single column arrangement, that is, 800 μm/(√2)≈566 μm.

Thus, the minimum length of the module 1 in the vertical direction can be reduced to 4463 μm. Here, (√X) is the square root of X.

As illustrated in FIG. 2(B), compared to the case where the adjacent solder balls 11 are arranged in the single column with the left ends thereof aligned, when the adjacent solder balls 11 are arranged in the 45-degree inclined directions, an area represented by sign a is reduced, and accordingly, the area of the substrates can be reduced. Although the specified angle is not limited to 45 degrees, the 45-degree inclined arrangement can reduce the length in the vertical direction most. By arranging some of the adjacent solder balls 11 in directions inclined at a specified angle as described above, the solder balls 11 can be closely arranged in the vertical direction (Y direction), and accordingly, the size of the module 1 can be reduced. Since the upper substrate 3 and the lower substrate 5 are supported by the molded portion 6, the strength between the upper substrate 3 and the lower substrate 5 can be maintained even when the solder balls 11 are arranged in the inclined directions.

In the module 1, for example, the solder balls 11 connected to the substrate vias 26 serve as GND balls and the solder balls 11 not connected to the substrate vias 26 serve as signal balls. The signal balls are connected to, for example, the LSIs 8 and 9 through the transmission lines. The GND balls are disposed outside (end side) the signal balls, which are adjacent to the GND balls in the X-Y plane, in the module 1. This can suppress leakage of microwave signals to the outside of the module 1 through the signal balls.

With the microwave circuit 7 according to the present disclosure, the adjacent plurality of solder balls 11 are horizontally (X direction) shifted from one another so as to be arranged in the inclined directions. Thus, the length, for example, in the vertical direction (Y direction) along the end portion of the upper substrate 3 or the lower substrate 5 can be reduced. Furthermore, when many solder balls 11 are provided, the solder balls 11 are arranged at the end portions of the substrates. Thus, cracks in the substrates can be suppressed and the size of the module 1 that includes the microwave circuit 7 can be reduced.

Although the adjacent solder balls 11 are arranged in the 45-degree inclined directions in the present embodiment, the adjacent solder balls 11 may be arranged in directions inclined at a specified angle other than 45 degrees. Also in this case, the similar effects can be obtained.

Although the solder balls 11 are arranged at the end portions in the X direction of the substrate in the example of the present embodiment, the solder balls 11 may be arranged at the end portion in the Y direction of the substrate in addition to or instead of the end portion in the X direction of the substrate. In this case, the length of the upper substrate 3 or the lower substrate 5 along the end portion in the horizontal direction (X direction) can be reduced. The pads for the plurality of solder balls connected to the GND may be connected to one another so as to increase a wiring area at a portion close to the prohibited area on the outer peripheral side of the package substrates. This may further suppress cracks in the substrate.

Second Embodiment

In the first embodiment, two LSIs are mounted on the lower substrate. In a second embodiment, the LSIs are respectively mounted on the upper substrate and the lower substrate.

In the microwave circuit according to the second embodiment, the same elements as those in the first embodiment are denoted by the same or corresponding reference signs, and description thereof is omitted or simplified.

Figure 3:
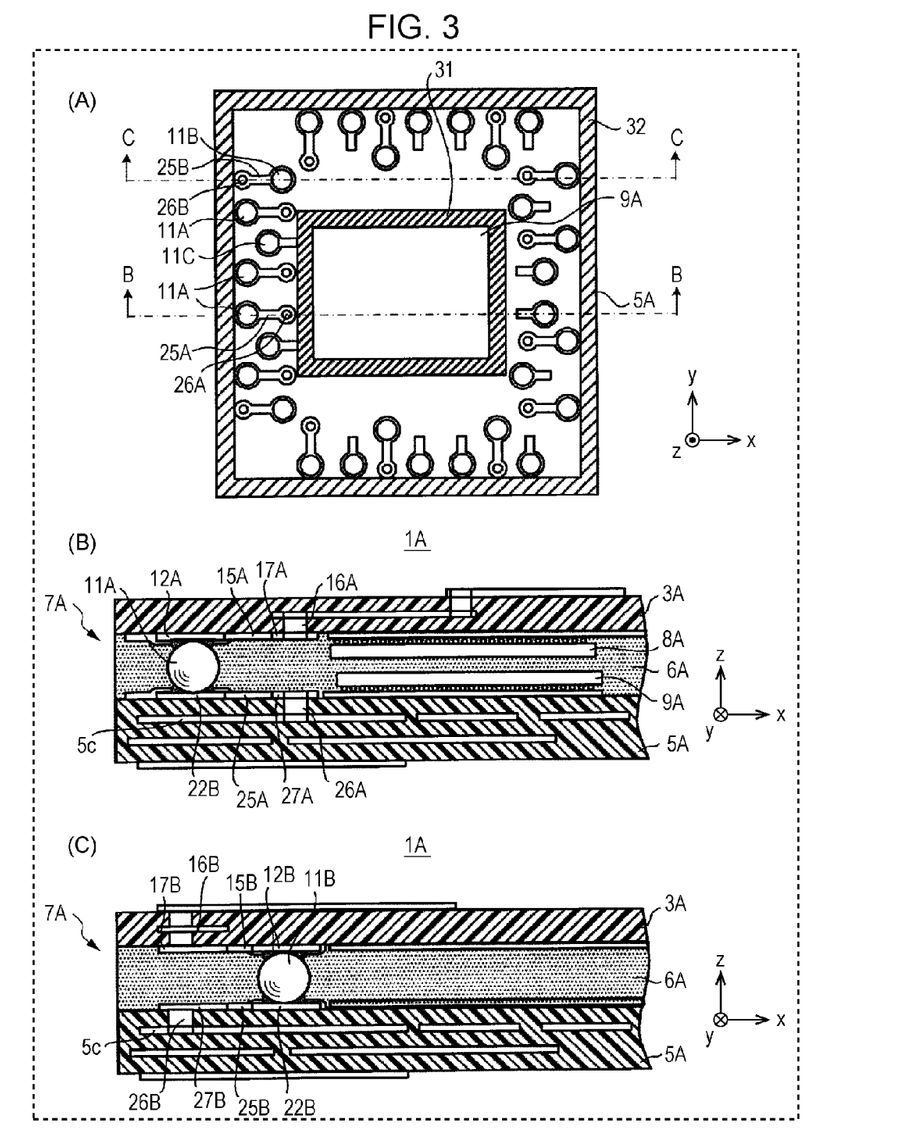
FIG. 3 is a plan view of an example of a structure of a module in which a microwave circuit according to a second embodiment is disposed, a sectional view of the module taken along line B-B, and a sectional view of the module taken along line C-C.

FIG. 3(A) is a plan view of an example of a structure of a module that includes a microwave circuit according to the second embodiment. FIG. 3(A) illustrates the surface of a lower substrate 5A when a module 1A is seen through from above (positive Z-axis direction). FIG. 3(B) is a sectional view of the example of the structure of the module 1A taken along line B-B in FIG. 3(A). FIG. 3(C) is a sectional view of the example of the structure of the module 1A taken along line C-C in FIG. 3(A). Parts of right ends (end portions in the positive X-axis direction) are omitted from FIG. 3(B) and FIG. 3(C), respectively.

As illustrated in FIG. 3(B), LSIs 8A and 9A are respectively mounted on a lower surface of an upper substrate 3A and an upper surface of the lower substrate 5A such that the LSIs 8A and 9A oppose each other. That is, the positions of the LSIs 8A and 9A are superposed with each other in a thickness direction (Z direction) of the module 1A.

An antenna (not illustrated) is mounted on the upper substrate 3A. The LSI 8A includes a RF (radio frequency) circuit (an example of a first signal processing circuit), which is positioned close to the antenna. The LSI 9A on the lower substrate 5A includes a base band circuit (an example of a second signal processing circuit).

When two LSIs 8A and 9A are mounted on different substrates, the number of members connecting the substrates to each other (for example, solder balls, vias, GND patterns) increases. Thus, many solder balls 11A and 11B are disposed along the periphery of the module 1A.

As in the first embodiment, a molded portion 6A is provided between the upper substrate 3A and the lower substrate 5A so as to support these substrates. The molded portion 6A is formed by, for example, filling with resin.

Referring to FIG. 3(A), the number of solder balls arranged in the Y direction is 8×2. The number of solder balls arranged in the X direction is 7×2. However, the number of solder balls is not limited to these.

In the present embodiment, solder balls disposed outside (on the end portion side of) substrate vias 26A in the module 1A are referred to as the solder balls 11A. Solder balls disposed further to the inside (central portion side) of the module 1A than the substrate vias 26A are referred to as the solder balls 11B. Solder balls arranged with the solder balls 11A in directions inclined at a specified angle (for example, 45 degrees) relative to a direction along an end portion (Y direction) of the lower substrate 5A as in the first embodiment are referred to as solder balls 11C.

Among the substrate vias, substrate vias referred to as the substrate vias 26A are disposed on the central portion side in the lower substrate 5A so as to correspond to the solder balls 11A, and substrate vias referred to as substrate vias 26B are disposed on the end portion side in the lower substrate 5A so as to correspond to the solder balls 11B.

As illustrated in FIG. 3(A), positions of some of the solder balls 11A and 11B and some of the substrate vias 26A and 26B are alternately exchanged. Although the diameter of the solder balls 11A and 11B are different from the diameter of the substrate vias 26A and 26B, the solder balls 11A and 11B and the substrate vias 26A and 26B are closely arranged in the Y direction because of the above-described arrangement.

For example, as illustrated in FIG. 3(B), one of the solder balls 11A is disposed on the end portion side in the lower substrate 5A at a position of line B-B. This solder ball 11A is connected to, for example, the GND layer 5c through a solder ball pad 22A, a transmission line 25A, a pad 27A, and the substrate via 26A, which is disposed closer to the central portion side of the lower substrate 5A than the solder ball 11A. The substrate vias 26A are electrically conductive vias and have a smaller diameter than that of the solder balls 11A. The solder balls 11A are an example of the first electrically conductive members. The substrate vias 26A are an example of the second electrically conductive members.

For example, as illustrated in FIG. 3(C), one of the solder balls 11B is disposed on the central portion side of the lower substrate 5A at a position of line C-C. This solder ball 11B is connected to, for example, the GND layer 5c through a solder ball pad, a transmission line 25B, a pad, and the substrate via 26B, which is disposed closer to the end portion side than the solder ball 11B in the lower substrate 5A. The substrate vias 26B are electrically conductive vias and have a smaller diameter than that of the solder balls 11B. The solder balls 11B are an example of the first electrically conductive members. The substrate vias 26B are an example of the second electrically conductive members.

Among the solder balls 11A, balls connected to the substrate vias 26A through the transmission lines 25A are, for example, GND balls, and balls connected to, for example, the wiring pattern or the LSIs on the same substrate through transmission lines are, for example, signal balls.

Among the solder balls 11B, balls connected to the substrate vias 26B through the transmission lines 25B are, for example, GND balls, and balls connected to, for example, the wiring pattern or the LSIs on the same substrate through transmission lines are, for example, signal balls.

The solder balls 11C are signal balls and serve as an example of third electrically conductive member.

Figure 4:
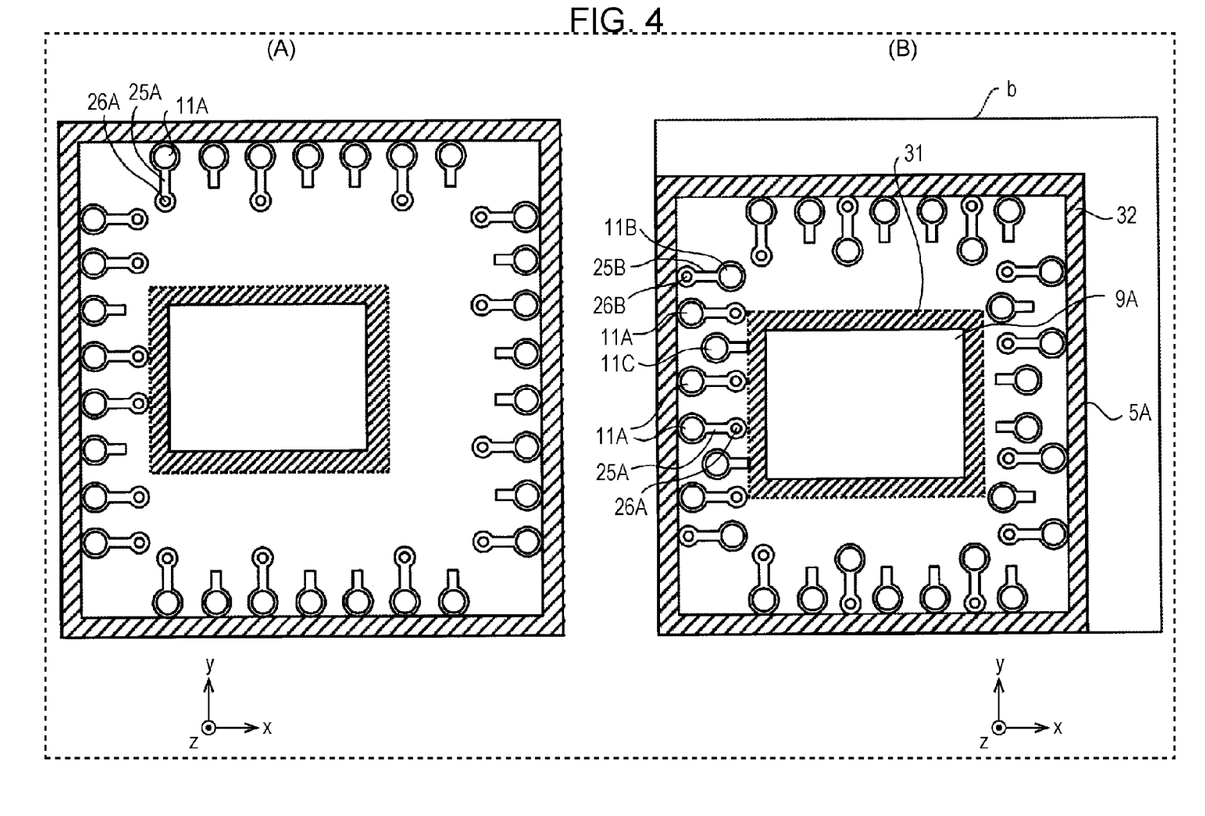
FIG. 4 is a schematic view illustrating a comparative example of arrangement of solder balls in the second embodiment and a schematic view illustrating an example of arrangement of the solder balls in the second embodiment.

FIGS. 4(A) and 4(B) are schematic views illustrating a comparative example and an example of arrangement of the solder balls 11A, 11B, and 11C. As illustrated in FIG. 4(A), assuming that the solder balls are arranged in a single row or column along each of end portions of the lower substrate 5A. In this case, when the thickness of the LSIs 8A and 9A embedded in the module 1A is, for example, 100 μm, which is thinner than that in the first embodiment, and the height of the mounting portions of the LSIs is 50 μm, which is the same as that in the first embodiment, it is required that the diameter of the solder balls be, for example, 400 μm.

In order to separate an end of one of the solder balls and an end of another solder ball by 400 μm, the center-to-center distance between the adjacent solder balls is 800 μm. When eight solder balls are arranged in each of the columns as illustrated in FIG. 4(A), the length of a portion where eight solder balls are arranged in the vertical direction (Y direction) is, for example, 6000 μm, and the external dimensions of the module are, for example, 9200 μm (vertical direction)×9000 μm (horizontal direction).

In contrast, in the present embodiment, as illustrated in FIG. 4(B), the positions of at least some of the solder balls 11C and the adjacent solder balls are arranged in the 45-degree inclined directions, and the positions of at least some of the solder balls 11A and 11B and the substrate vias 26A and 26B are alternately exchanged. In this case, the external dimensions of the module 1A are, for example, 8200 μm (vertical direction)×7700 μm (horizontal direction).

When the adjacent solder balls are arranged in directions inclined at a specified angle and the positions thereof are alternately exchanged as described above, the size of the module 1A is reduced by an area denoted by sign b extending in the vertical direction (Y direction) and in the horizontal direction (X direction) compared to the case where the solder balls are arranged in a single row or column at each end of the substrate of the module 1A. Also, the upper substrate 3A and the lower substrate 5A are supported by the molded portion 6A. With the molded portion 6A, the position of the lower substrate 5A relative to the upper substrate 3A can be secured. Thus, strength between the upper substrate 3A and the lower substrate 5A can be maintained even when the solder balls 11C and the adjacent solder balls are disposed in the 45-degree inclined directions, and at least some of the solder balls 11A and 11B and the substrate vias 26A and 26B are alternately exchanged.

In a microwave circuit 7A according to the present disclosure, even when the LSIs 8A and 9A are respectively mounted on the upper substrate 3A and the lower substrate 5A, and the number of members (such as solder balls and vias) that connect the substrates to each other increases, cracks in the substrates can be suppressed and the size of the module 1A can be reduced. That is, by arranging at least some of the adjacent balls in directions inclined at a specified angle, the connecting members between the substrates can be closely disposed in directions along the end portions of the substrates (X and Y directions). Furthermore, by alternately disposing the solder balls and the vias, the connecting members between the substrates can be further closely disposed in the X or Y directions. Since the connecting members between the substrates can be further closely disposed in the X or Y directions as described above, the size of the module 1A can be further reduced.

Furthermore, the GND balls are disposed closer to the end portion side than the signal balls in the substrate. This can suppress leakage of microwave signals through the signal balls to the outside of the module 1A.

Furthermore, since the LSIs 8A and 9A are mounted on the respective substrates in the microwave circuit 7A, the LSIs are stacked one on top of the other in the Z direction. This facilitates a reduction in size of the module 1A.

As is the case with the first embodiment, similar effects can be obtained even when the adjacent solder balls are arranged in directions inclined at a specified angle other than 45 degrees. Furthermore, the following case may be considered: that is, the LSIs 8A and 9A are arranged on the lower substrate 5A similarly to the first embodiment instead of being arranged on the upper substrate 3A and the lower substrate 5A, or the LSIs 8A and 9A are not arranged. Also in this case, the solder balls and the substrate vias may be alternately exchanged. The similar effects can be obtained with this arrangement. Although the solder balls are disposed only at the outer peripheral ends of the substrate in the example described above, the solder balls may be arranged on the inner side of the substrate so as to surround the LSI. This can prevent radio wave radiation from the LSIs. In this case, it is preferable that the distance between the solder balls be equal to or less than ¼ of the wavelength of the frequency of the signal that radiates radio wave radiation to be suppressed.

Third Embodiment

In a third embodiment, the upper substrate and the lower substrate are connected to each other through vias instead of solder balls.

Figure 5:
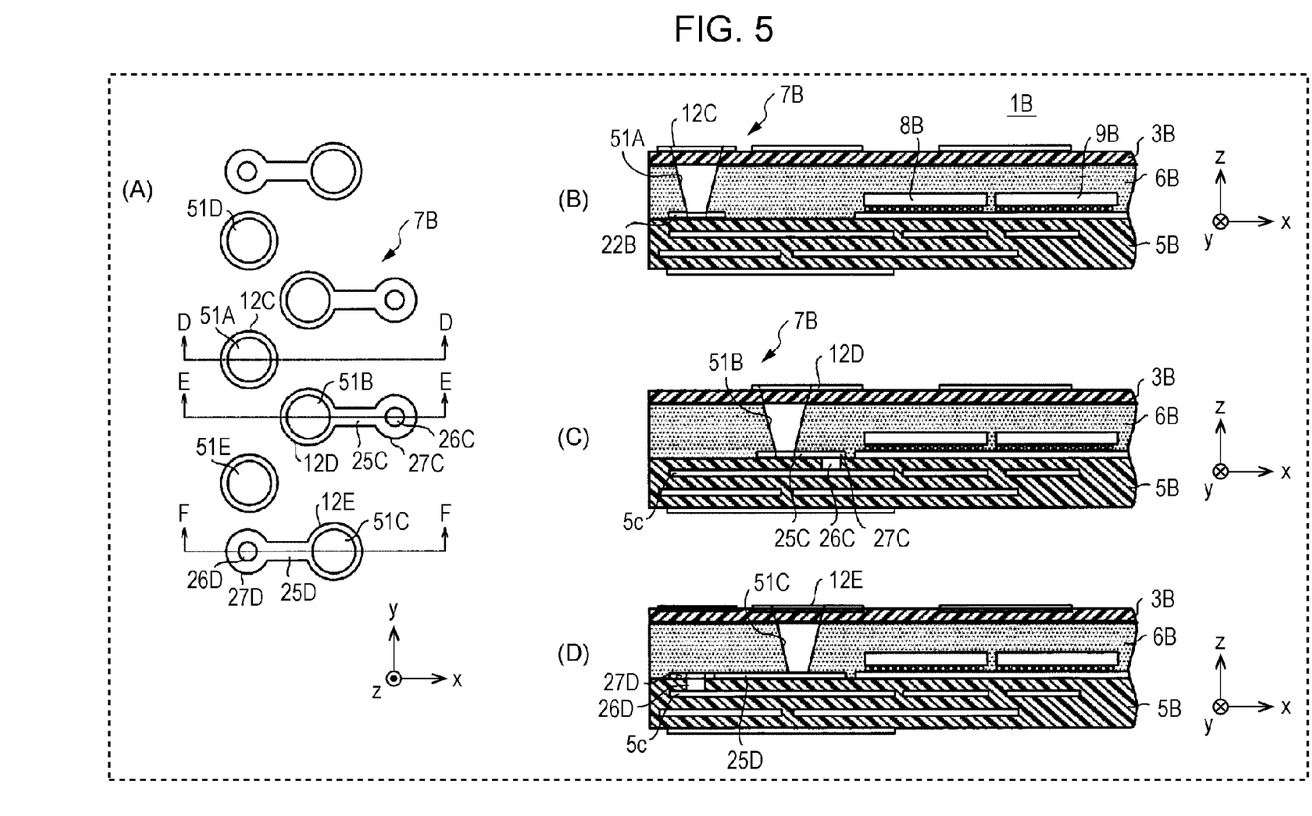
FIG. 5 is a plan view of an example of a structure of a module that includes a microwave circuit according to a third embodiment, a sectional view of the module taken along line D-D, a sectional view of the module taken along line E-E, and a sectional view of the module taken along line F-F.

FIGS. 5(A) to 5(D) are plan views of an example of a structure of a module 1B in which a microwave circuit 7B according to the third embodiment is disposed. FIG. 5(A) illustrates part of a right end portion (end portion in the negative X direction) of the surface of a lower substrate 5B when the module 1B is seen through from above (positive Z-axis direction). FIG. 5(B) is a sectional view of the example of the structure of the module 1B taken along line D-D in FIG. 5(A). FIG. 5(C) is a sectional view of the example of the structure of the module 1B taken along line E-E in FIG. 5(A). FIG. 5(D) is a sectional view of the example of the structure of the module 1B taken along line F-F in FIG. 5(A). The same elements as those in the first embodiment are denoted by the same or corresponding reference signs, thereby description thereof is omitted or simplified.

FIG. 5(A) illustrates an example of arrangement of molded-portion through vias 51A to 51E, molded-portion through-via pads 12C to 12E, transmission lines 25C and 25D, substrate vias 26C and 26D, and substrate-via pads 27C and 27D in the lower substrate 5B.

The molded-portion through via 51A allows electrical conduction between a pad 22B formed on the lower substrate 5B and the pad 12C formed on the upper substrate 3B so as to communicate a microwave signal. The molded-portion through via 51B (an example of the first electrically conductive members) is connected to, for example, the GND layer 5c of the lower substrate 5B through the substrate via 26C. The molded-portion through via 51C is connected to, for example, the GND layer 5c through the substrate via 26D.

Similarly to the first and second embodiments, the molded-portion through via 51B is arranged with the adjacent molded-portion through vias 51A and 51E in directions extending in a specified angle (for example, 45 degrees).

Furthermore, the positional relationship between the molded-portion through via 51C and the substrate via 26D and the positional relationship between the molded-portion through via 51B and the substrate via 26C are exchanged. That is, the molded-portion through via 51B is disposed on an end portion side of the lower substrate 5B, and the substrate via 26C is disposed on a central portion side of the lower substrate 5B. In contrast, the molded-portion through via 51C is disposed on the central portion side of the lower substrate 5B, and the substrate via 26D is disposed on the end portion side of the lower substrate 5B. The molded-portion through vias 51D and 51E are disposed on the end portion side of the lower substrate 5B and connected to, for example, the GND pattern of the GND layer 5c.

In the module 1B, for example, LSIs 8B and 9B are mounted on the lower substrate 5B. Assuming that the height of the LSIs 8B and 9B is, for example, 350 µm, the thickness of a molded portion 6B where the molded-portion through vias 51A to 51E are formed is, for example, about 400 µm. When the molded-portion through vias 51A to 51E are formed, the diameter of the molded-portion through vias 51A to 51E on the lower substrate 5B side is smaller than that on the upper substrate 3B side.

The diameter of the molded-portion through vias 51A to 51E are, for example, 200 µm on the lower substrate 5B side and, for example, 400 µm on the upper substrate 3B side. The diameter of the lands of the molded-portion through vias 51A to 51E is calculated by adding, for example, 200 µm to the diameter of the molded-portion through vias 51A to 51E.

The diameter of the substrate via 26C is, for example, 100 µm, and the land of the substrate via 26C is calculated by adding, for example, 100 µm to the diameter of the substrate via 26C.

Thus, the size of the module 1B can be reduced by arranging the two types of vias having different diameters (for example, molded-portion through via and substrate via) in the inclined directions and by alternately exchanging the positions of at least some of the molded-portion through vias and the substrate vias.

In the microwave circuit 7B according to the present disclosure, cracks in the substrates can be suppressed and the size of the module 1B can be reduced even in the case where many vias having different diameters are provided instead of solder balls.

Figure 6:
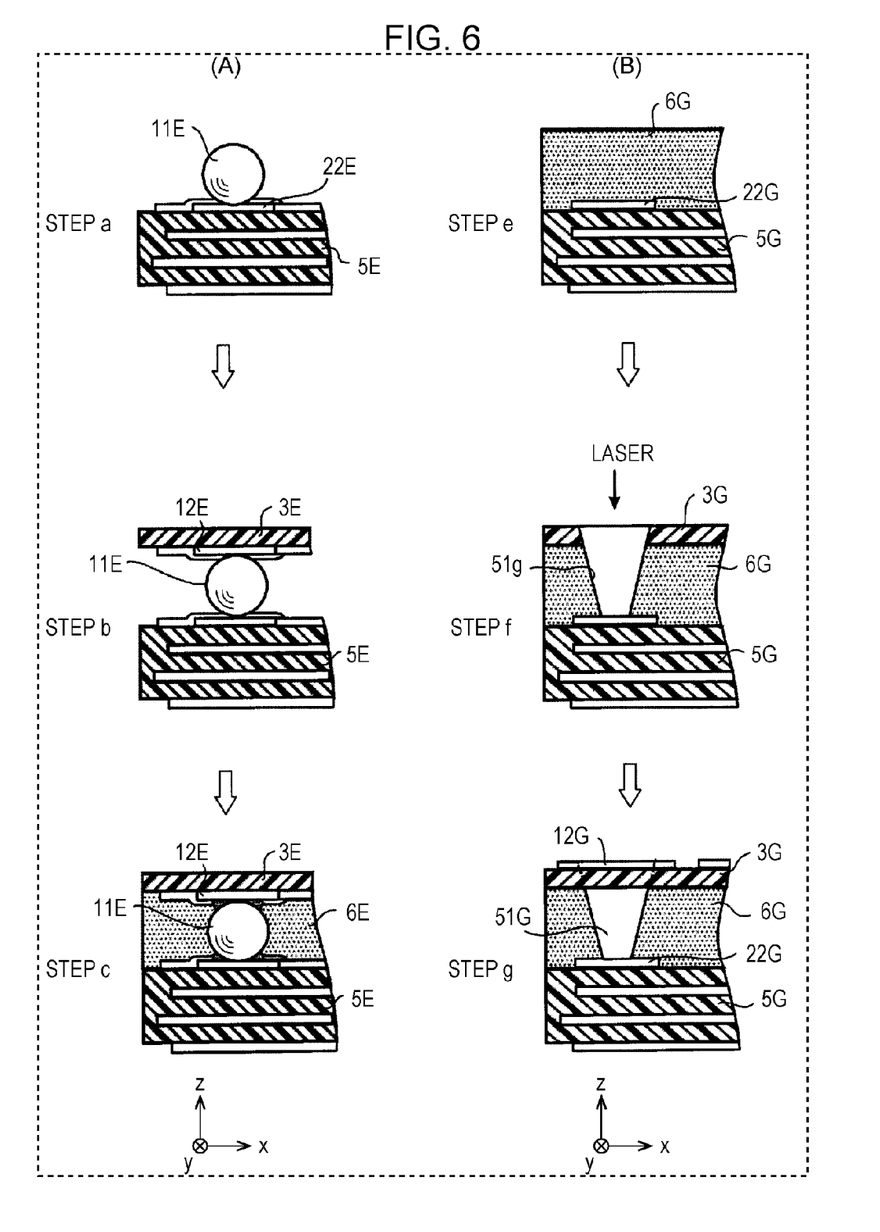
FIG. 6 is a schematic view illustrating steps for producing a module according to the first and second embodiments and a schematic view illustrating steps for producing a module according to the third embodiment.

Here, methods of producing the module in the case where the solder balls are used to connect the substrates to each other and in the case where the molded-portion through vias are used to connect the substrates to each other are generally described. FIGS. 6(A) and 6(B) are schematic views illustrating examples of the methods of producing the module.

As described in the first and second embodiments, when the solder balls are used to connect the substrates to each other, the module is produced through example steps illustrated in FIG. 6(A). Initially, a lower substrate 5E is prepared, and a solder ball 11E is placed on a pad 22E formed on a surface of the lower substrate 5E (STEP a). An upper substrate 3E is stacked on the upper surface of the lower substrate 5E so as to pinch the solder ball 11E therebetween. The resultant stack is subjected to, for example, heating (STEP b). Then, the gap formed between the upper substrate 3E and the lower substrate 5E by the solder ball 11E is filled with resin so as to form a molded portion (STEP c). Thus, the upper substrate 3E and the lower substrate 5E are connected to each other through the solder ball 11E.

In the case where the molded-portion through via is used to connect the substrates to each other, the module is produced through example steps illustrated in FIG. 6(B). Initially, a lower substrate 5G is prepared. For example, a resin molded portion 6G, which is part of a dielectric layer, is formed on an upper surface of the lower substrate 5G having a pad 22G formed thereon (STEP e). An upper substrate 3G is placed on the resin molded portion 6G, and a laser is radiated to the upper substrate 3G and the resin molded portion 6G so as to form a hole 51g having a shape conforming to the external shape of the via and penetrating through parts of the upper substrate 3G and the resin molded portion 6G (STEP f). By applying an electrically conductive material to the hole 51g, a molded-portion through via 51G is formed. Furthermore, a pad 12G is formed (STEP g). Thus, by forming the molded-portion through via 51G with, for example, the laser, the upper substrate 3G and the lower substrate 5G are connected to each other. The laser radiation may be performed before the upper substrate 3G is bonded to the lower substrate 5G.

The present disclosure is not limited to the structures of the above-described embodiments. The present disclosure is applicable to any structure as long as the functions described in the scope of the claims or the functions of the structures of the present embodiments can be achieved.

For example, in the example of the third embodiment, a wiring pattern is formed on the upper substrate 3B. Alternatively, the wiring pattern may be directly formed on the molded portion 6B without using the upper substrate 3B. Although only the example in which the vias are used instead of the solder balls is described in the above description, it is needless to say that both the solder balls and the vias can be used.

General Description of Embodiment of Present Disclosure

A first microwave circuit according to the present disclosure includes a first substrate that is a multilayer substrate, a second substrate that opposes the first substrate, a plurality of first electrically conductive members that electrically connect a first layer of the first substrate and the second substrate to each other, a plurality of second electrically conductive members that electrically connect the first layer of the first substrate and another layer of the first substrate to each other, and each of the plurality of second electrically conductive members has a smaller diameter than that of each of the first electrically conductive members, and transmission lines that connect the first electrically conductive members and the second electrically conductive members. In the microwave circuit, the plurality of first electrically conductive members and the plurality of second electrically conductive members are alternately disposed along an end portion of the first substrate.

A second microwave circuit according to the present disclosure is the first microwave circuit in which at least one of the plurality of first electrically conductive members is disposed along a plurality of the end portions of the first substrate, and the other first electrically conductive member is disposed closer to a central portion side of the first substrate than the at least one of the plurality of first electrically conductive members.

A third microwave circuit according to the present disclosure is the first or second microwave circuit in which the first electrically conductive members are electrically conductive balls, and the second electrically conductive members are electrically conductive vias.

A fourth microwave circuit according to the present disclosure is the first or second microwave circuit in which the first electrically conductive members and the second electrically conductive members are electrically conductive vias.

A fifth microwave circuit according to the present disclosure is any one of the first to fourth microwave circuit which further includes a molded portion formed by filling a space between the first substrate and the second substrate with resin.

A sixth microwave circuit according to the present disclosure is any one of the first to fifth microwave circuit which further includes a third electrically conductive member that electrically connects the first layer of the first substrate and the second substrate opposing the first substrate to each other, or that electrically connects the first layer of the first substrate and the other layer of the first substrate to each other. In the microwave circuit, the first electrically conductive members are electrically conductive members for grounding, the third electrically conductive member is an electrically conductive member for signal transmission, and the first electrically conductive members are disposed closer to the end portion of the first substrate than the third electrically conductive member.

A seventh microwave circuit according to the present disclosure is the sixth microwave circuit which further includes a first signal processing circuit that is mounted on the first substrate; and a second signal processing circuit that is mounted on the second substrate, in which the third electrically conductive member electrically connects the first layer of the first substrate and the second substrate that opposes the first substrate.

INDUSTRIAL APPLICABILITY

The present disclosure is useful for a microwave circuit or the like with which cracks in substrates can be suppressed and which can reduce the size of a module including the microwave circuit.

REFERENCE SIGNS LIST 1, 1A, 1B module
3, 3A, 3B, 3E, 3G upper substrate
5, 5A, 5B, 5E, 5G lower substrate
5a metal layer
5b dielectric layer
5c GND layer
6, 6A, 6B, 6E, 6G molded resin
7, 7A, 7B microwave circuit
8, 8A, 8B, 9, 9A, 9B LSI
11, 11A, 11B, 11C, 11E, 11G, 19 solder ball
12, 12A, 12B, 12C, 12E, 12G, 22, 22A, 22B, 22C, 22E, 22G pad
15, 15A, 15B, 25, 25A, 25B, 25C, 25D transmission line
16, 16A, 16B, 26, 26A, 26B, 26C, 26D substrate via
17, 17A, 17B, 18, 27, 27A, 27B, 27C, 27D via pad
31, 32 prohibited area
51A, 51B, 51C, 51D, 51E, 51G molded-portion through via
51g hole

The invention claimed is:

1. A microwave circuit comprising:
a first substrate that is a multilayer substrate;
a second substrate that opposes the first substrate;
a plurality of first electrically conductive members that electrically connect a first layer of the first substrate and the second substrate to each other, the plurality of first electrically conductive members being arranged in a zigzag manner along at least one side of the first substrate;
a plurality of second electrically conductive members that electrically connect the first layer of the first substrate and another layer of the first substrate to each other, each of the plurality of second electrically conductive members having a diameter smaller than a diameter of each of the first electrically conductive members; and
transmission lines that connect the first electrically conductive members and the second electrically conductive members,
wherein the plurality of first electrically conductive members and the plurality of second electrically conductive members are alternately disposed along the at least one side of the first substrate.

2. The microwave circuit according to claim 1,
wherein at least one of the plurality of first electrically conductive members is disposed along the at least one side of the first substrate, and the other first electrically conductive member of the plurality of first electrically conductive members is disposed closer to a center of the first substrate than the at least one of the plurality of first electrically conductive members.

3. The microwave circuit according to claim 1,
wherein the first electrically conductive members are electrically conductive balls, and the second electrically conductive members are electrically conductive vias.

4. The microwave circuit according to claim 1,
wherein the first electrically conductive members and the second electrically conductive members are electrically conductive vias.

5. The microwave circuit according to claim 1, further comprising:
a molded portion with resin filled between the first substrate and the second substrate.

6. The microwave circuit according to claim 1, further comprising:

a third electrically conductive member that electrically connects the first layer of the first substrate and the second substrate to each other, the second substrate facing the first substrate, or that electrically connects the first layer of the first substrate and the other layer of the first substrate to each other, wherein the first electrically conductive members are electrically conductive members for grounding, the third electrically conductive member is an electrically conductive member for signal transmission, and the first electrically conductive members are disposed closer to the at least one side of the first substrate than the third electrically conductive member.

7. The microwave circuit according to claim 6, further comprising:
a first signal processing circuit that is mounted on the first substrate; and
a second signal processing circuit that is mounted on the second substrate,
wherein the third electrically conductive member electrically connects the first layer of the first substrate and the second substrate facing the first substrate.

8. The microwave circuit according to claim 1,
wherein the plurality of first electrically conductive members include a first member, a second member and a third member that are arranged in a zigzag manner in a first direction along a side of the first substrate, such that the first member and the third member are aligned in a line extending in the first direction along the side of the first substrate, and are adjacent to each other among the plurality of first electrically conductive members, and the second member is positioned between the first member and the third member in the first direction, and is spaced from the first member and the third member in a second direction, which is orthogonal to the first direction, and
wherein one of the plurality of second electrically conductive members is positioned between the first member and the third member on the line in which the first member and the third member are aligned, so that the plurality of first electrically conductive members and the plurality of second electrically conductive members are alternately disposed in the first direction.

9. A microwave circuit comprising:
a first substrate that is a multilayer substrate;
a second substrate that opposes the first substrate;
a plurality of first electrically conductive members that electrically connect a first layer of the first substrate and the second substrate to each other;
a plurality of second electrically conductive members that electrically connect the first layer of the first substrate and another layer of the first substrate to each other, each of the plurality of second electrically conductive members having a diameter smaller than a diameter of each of the first electrically conductive members; and
transmission lines that connect the first electrically conductive members and the second electrically conductive members,
wherein the plurality of first electrically conductive members include a first member, a second member and a third member,
the first member and the third member are aligned in a line extending in a first direction along a side of the first substrate, and are adjacent to each other among the plurality of first electrically conductive members,
the second member is positioned between the first member and the third member in the first direction, and is spaced from the first member and the third member in a second direction, which is orthogonal to the first direction, and
one of the plurality of second electrically conductive members is positioned between the first member and the third member on the line in which the first member and the third member are aligned.

10. The microwave circuit according to claim 9,
wherein the second member is positioned closest to the first member among the plurality of first electrically conductive members, and the third member is positioned closest to the second member among the plurality of first electrically conductive members.

11. The microwave circuit according to claim 9,
wherein the second member is positioned closer to a center of the first substrate than the first member and the third member.

* * * * *